(12) United States Patent
Sugane et al.

(10) Patent No.: US 9,992,878 B2
(45) Date of Patent: Jun. 5, 2018

(54) CIRCUIT BOARD AND METHOD OF MANUFACTURING THE SAME

(71) Applicant: FUJITSU LIMITED, Kawasaki-shi, Kanagawa (JP)

(72) Inventors: Mitsuhiko Sugane, Ichikawa (JP); Akiko Matsui, Meguro (JP); Takahide Mukoyama, Kamakura (JP); Tetsuro Yamada, Kawasaki (JP); Yoshiyuki Hiroshima, Nakano (JP); Kohei Choraku, Yokohama (JP)

(73) Assignee: FUJITSU LIMITED, Kawasaki (JP)

(*) Notice: Subject to any disclaimer, the term of this patent is extended or adjusted under 35 U.S.C. 154(b) by 0 days. days.

(21) Appl. No.: 14/929,502

(22) Filed: Nov. 2, 2015

(65) Prior Publication Data

US 2016/0192486 A1    Jun. 30, 2016

(30) Foreign Application Priority Data

Dec. 26, 2014   (JP) ................................. 2014-265192

(51) Int. Cl.
| | |
|---|---|
| H05K 1/02 | (2006.01) |
| H05K 1/16 | (2006.01) |
| H05K 3/46 | (2006.01) |
| H05K 3/34 | (2006.01) |
| H05K 3/42 | (2006.01) |

(52) U.S. Cl.
CPC ......... *H05K 3/4623* (2013.01); *H05K 1/0231* (2013.01); *H05K 1/162* (2013.01); *H05K 1/0298* (2013.01); *H05K 3/3436* (2013.01); *H05K 3/429* (2013.01)

(58) Field of Classification Search
CPC .... H05K 3/4623; H05K 1/162; H05K 1/0231; H05K 3/3436; H05K 3/429
See application file for complete search history.

(56) References Cited

U.S. PATENT DOCUMENTS

| | | | | |
|---|---|---|---|---|
| 5,010,641 | A | | 4/1991 | Sisler |
| 5,079,069 | A | | 1/1992 | Howard et al. |
| 5,315,072 | A | * | 5/1994 | Arai ...................... H05K 1/113 174/250 |
| 5,979,044 | A | * | 11/1999 | Sumi ...................... H05K 1/113 174/262 |
| 6,333,857 | B1 | * | 12/2001 | Kanbe ............... H01L 23/49822 174/262 |
| 6,580,036 | B2 | * | 6/2003 | Kim .................... H05K 3/4623 174/255 |

(Continued)

FOREIGN PATENT DOCUMENTS

| | | |
|---|---|---|
| JP | 11-214853 | 8/1999 |
| JP | 11-251801 | 9/1999 |

*Primary Examiner* — Ishwarbhai B Patel
(74) *Attorney, Agent, or Firm* — Fujitsu Patent Center

(57) ABSTRACT

A circuit board disclosed herein includes: two substrates opposed to each other, where a dielectric being interposed between the two substrates; a through hole formed in each of the two substrates and filled with the dielectric; a first conductor film formed on an inner surface of the through hole; and a second conductor film covering the through hole on a main surface of each of the two substrates on an opposite side to the dielectric, the second conductor film being connected to the first conductor film on the main surface side.

9 Claims, 21 Drawing Sheets

(56) References Cited

U.S. PATENT DOCUMENTS

| | | | | |
|---|---|---|---|---|
| 6,750,404 B1* | 6/2004 | Anslow | ................ | H05K 1/113 |
| | | | | 174/261 |
| 6,972,382 B2* | 12/2005 | Zollo | ................ | H05K 3/4623 |
| | | | | 174/262 |
| 7,387,917 B2* | 6/2008 | Choi | ................ | H01L 21/4857 |
| | | | | 257/E23.062 |

* cited by examiner

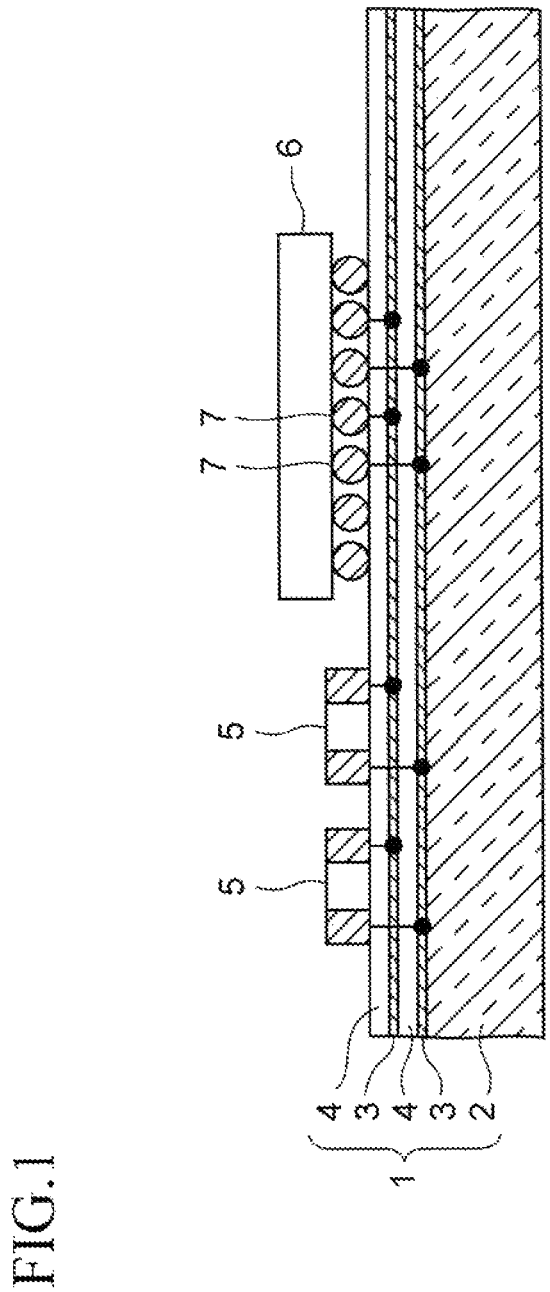

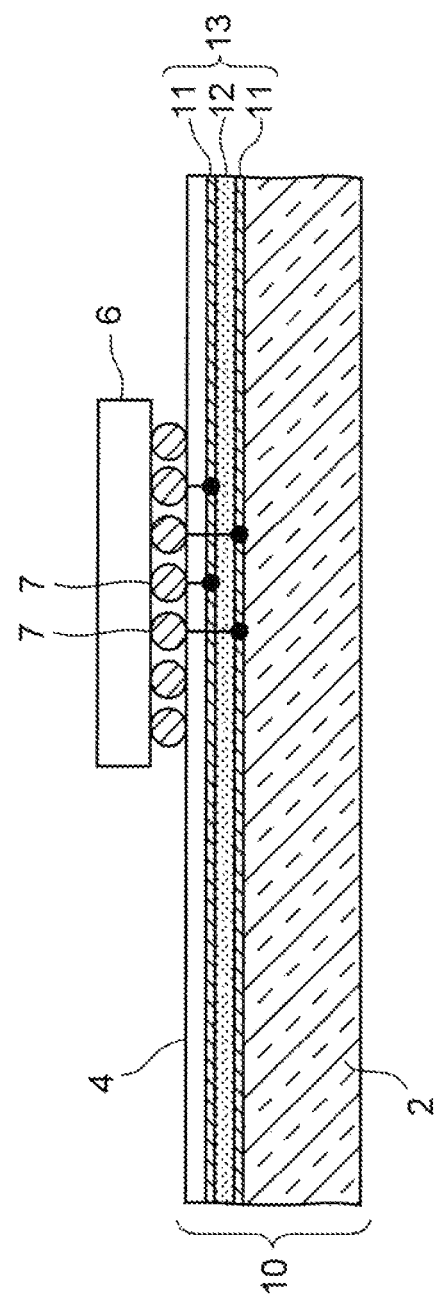

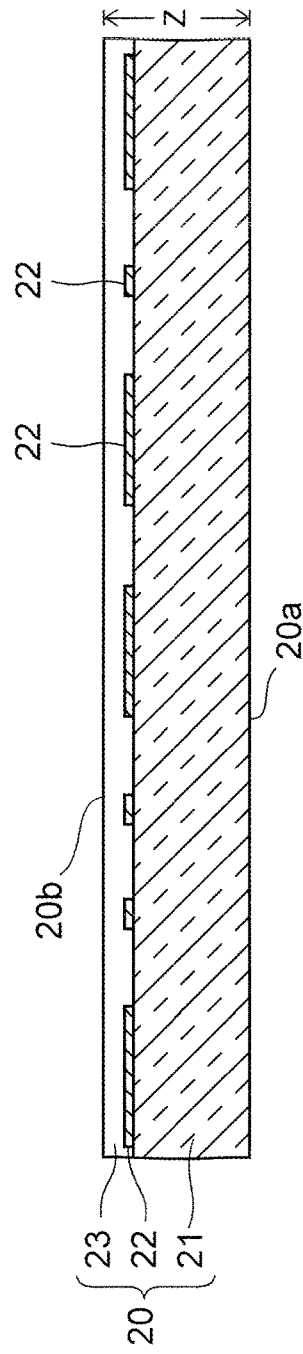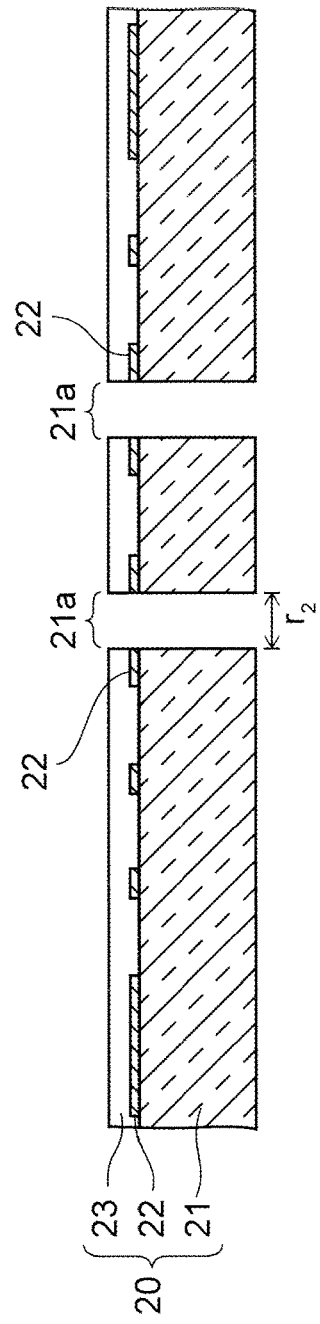
FIG.3A
FIG.3B

CIRCUIT BOARD AND METHOD OF MANUFACTURING THE SAME

CROSS-REFERENCE TO RELATED APPLICATION

This application is based upon and claims the benefit of priority of the prior Japanese Patent Application No. 2014-265192, filed on Dec. 26, 2014, the entire contents of which are incorporated herein by reference.

FIELD

The embodiments discussed herein are related to a circuit board and a method of manufacturing the same.

BACKGROUND

Savers and network apparatuses use various circuit boards on which semiconductor devices are mounted. Capacitor components are mounted on the surface of the circuit board for the purpose of reducing power supply noise and the like. Due to an increase in transmission rate in recent years, there is a trend toward an increase in the number of capacitor components mounted on a single circuit board.

With an increase in the number of capacitor components as mentioned above, a proportion of the capacitor components to the circuit board increases so much that a constraint is imposed on a wiring layout of the circuit board.

In addition, the capacitor components are connected to a power supply layer and a ground layer via conductor films such as plating films inside through holes. However, due to the wiring lengths of the conductor films, the inductance components of the wirings may increase so much that an increase in the transmission rate may possibly be hindered.

To address this, there have been proposed several techniques of providing capacitors inside a circuit board instead of mounting capacitor components on a surface of the circuit board.

Techniques related to the present application have been disclosed in the following documents: U.S. Pat. No. 5,010,641, U.S. Pat. No. 5,079,069, Japanese Laid-open Patent Publication No. 11-251801, and Japanese Laid-open Patent Publication No. 11-214853.

SUMMARY

According to an aspect of the following disclosure, a circuit board is provided which includes: two substrates opposed to each other, where a dielectric being interposed between the two substrates; a through hole formed in each of the two substrates and filled with the dielectric; a first conductor film formed on an inner surface of the through hole; and a second conductor film covering the through hole on a main surface of each of the two substrates on an opposite side to the dielectric, the second conductor film being connected to the first conductor film on the main surface side.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 1 is a cross sectional view illustrating one example of a circuit board on which capacitor components are mounted;

FIG. 2 is a cross sectional view illustrating one example of a circuit board examined by the inventor of the present application;

FIGS. 3A to 3J are cross sectional views of a circuit board in the process of manufacturing according to a first embodiment;

DESCRIPTION OF EMBODIMENTS

Figure 3C:
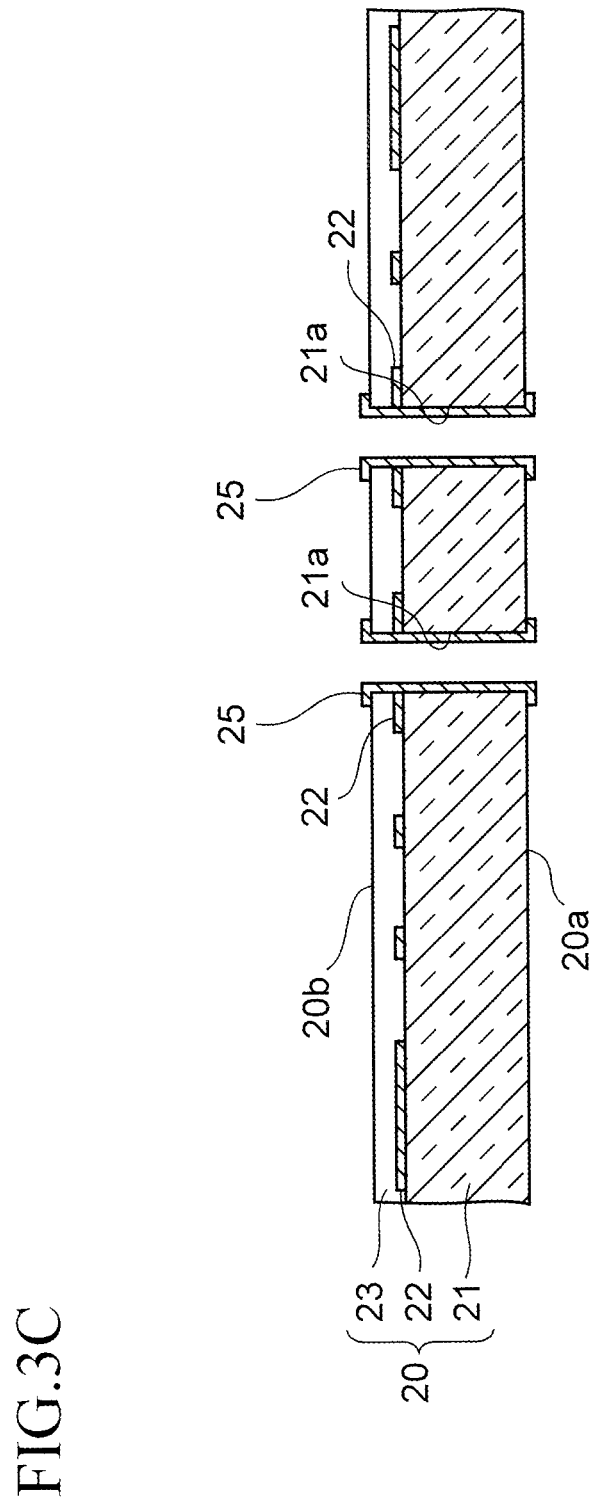

Prior to description of embodiments, matters having been examined by the inventor of the present application are described below.

As described above, a large number of capacitor components are mounted on a surface of a circuit board for the purpose of reducing power supply noise and the like.

FIG. 1 is a cross sectional view illustrating one example of a circuit board on which capacitor components are mounted as mentioned above.

In a circuit board 1, wiring layers 3 and insulation films 4 are alternately stacked on a resin base 2, and a semiconductor device 6 is mounted via solder bumps 7 on a surface of the circuit board 1.

In addition, plural capacitor components 5 are mounted beside the semiconductor device 6 on the circuit board 1.

The capacitor components 5 are connected to the wiring layers 3 functioning as a power supply layer or a ground layer, and play a role of reducing noise to be generated in the wiring layers 3.

An electrostatic capacitance of each capacitor component 5 is determined depending on a use purpose of a circuit board. For example, there is a case where a circuit board for use in a server with a transmission frequency of 3.2 GHz uses about 250 low-capacity capacitor components 5 with an electrostatic capacitance of about 10 pF. In this case, the total sum of the electrostatic capacitance in a single circuit board is about 2500 pF.

Moreover, in some cases, while such low-capacity capacitor components with about 10 pF are mounted on a circuit board, about 1000 medium-capacity capacitor components with an electrostatic capacitance of about 0.1 μF are together mounted on the circuit board for the purpose of removing noise in a power supply line having a high voltage.

When such a large number of capacitor components 5 are mounted on the circuit board 1, the proportion of the capacitor components 5 to the surface of the circuit board 1 increases so much that a constraint is imposed on the wiring layout on the surface of the circuit board 1, as described above.

One possible way to relax the constraint on the wiring layer is to incorporate the capacitor components 5 inside the circuit board 1 so that the capacitor components 5 may be cleared out from the surface of the circuit board 1. However, in this structure, if a defect is found in any of the capacitor components 5 after completion of the circuit board 1, the circuit board 1 may be disintegrated to replace the capacitor component 5 with a good one. Hence, this structure is impractical.

In addition, there is a simulation result teaching that one of methods for effective noise reduction by the capacitor components 5 is to limit the number of capacitor components 5 within a region having an area of about 22.9 mm² to 1. According to this result, it is not possible to arrange multiple capacitor components 5 close to each other, and a further constraint is imposed on the circuit board design.

Under these circumstances, the inventor of the present application examines a method of incorporating, in a circuit board, capacitors each having an electrostatic capacitance approximately equal to that of the capacitor component 5.

FIG. 2 is a cross sectional view illustrating one example of a circuit board used for the examination.

In FIG. 2, the same elements as those explained in FIG. 1 are indicated by the same reference numerals as those in FIG. 1, and the description thereof is omitted below.

This circuit board 10 includes two conductor films 11 functioning as a power supply layer or a ground layer, and a dielectric film 12 sandwiched between the two conductor films 11. The two conductor films 11 and the dielectric film 12 form a sheet-shaped capacitor 13.

Then, solder bumps 7 of a semiconductor device 6 are electrically connected to these conductor films 11.

In the circuit board 10 thus formed, since power supply noise may be reduced by the capacitor 13, any capacitor component to reduce the power supply noise does not need to be mounted on the surface of the circuit board 10. This relaxes the constraints on the wiring layout on the surface of the circuit board 10, and also produces room to mount electronic components other than the capacitor components on the circuit board 10.

Here, an electrostatic capacitance $C_0$ per unit area of the capacitor 13 may be calculated in accordance with the following formula (1) where $\mu_0$ denotes a dielectric constant of the dielectric film 12, and $t_0$ denotes a thickness of the dielectric film 12.

$$C=(\text{Proportionality Constant} \times \mu_0)/t_0 \qquad (1)$$

The inventor of the present application calculates the electrostatic capacitance $C_0$ per unit area by use of various values as the dielectric constant $\mu_0$ and the thickness $t_0$.

Table 1 presents the calculation results.

TABLE 1

| Thickness $t_0$ | Dielectric Constant $\mu_0$ | Electrostatic Capacitance $C_0$ |
|---|---|---|
| 100 μm | 4 | 0.0035 pF/cm² |
| 100 μm | 17.2 | 0.0150 pF/cm² |
| 50 μm | 4 | 0.0070 pF/cm² |
| 8 μm | 17.2 | 18 pF/m² |

Note that, in Table 1, a material having a dielectric constant $\mu_0$ of 4 is employed to represent FR4 (flame retardant type 4) obtained by impregnating glass fibre with epoxy resin, and a material having a dielectric constant $\mu_0$ of 17.2 is employed to represent PPE (polyphenyleneether resin).

According to Table 1, the electrostatic capacitance $C_0$ per unit area is at most about 18 pF/m² even under the conditions where $t_0$=8 μm and $\mu_0$=17.2, which achieve the largest electrostatic capacitance $C_0$. With this value, the capacitor 13 needs to have an area of a hundred and several tens of square meters to obtain the aforementioned electrostatic capacitance of about 2500 pF. This is impractical.

In addition, the manufacturing of the circuit board 10 involves bonding the sheet-shaped capacitor 13 onto the resin base 2. However, when the thickness $t_0$ is 8 μm, the capacitor 13 is too thin and is difficult to handle. For this reason, it is not possible to finely bond the capacitor 13 onto the resin base 2, and a defect may possibly occur in the circuit board 10. Hence, mass production of circuit boards 10 is very difficult in practice.

Hereinafter, description is provided for embodiments which enable a capacitor having a sufficiently large electrostatic capacitance to be incorporated inside a circuit board.

First Embodiment

Hereinafter, a circuit board according to a first embodiment is described based on a sequence of a method of manufacturing the same.

FIGS. 3A to 3J are cross sectional views of a circuit board in the process of manufacturing according to the first embodiment.

First, as illustrated in FIG. 3A, a substrate 20 is formed by laminating a wiring layer 22 and an inter-layer insulation film 23 in this order on a resin base 21 made of an epoxy resin or the like.

This substrate 20 includes a first main surface 20a and a second main surface 20b on the front and back sides, and has a thickness Z of about 0.5 mm to 1 mm, for example. In this example, the surface on the resin base 21 side is the first main surface 20a and the surface on the inter-layer insulation film 23 side is the second main surface 20b.

Note that, the method of forming each layer in the substrate 20 is not particularly limited. For example, the wiring layer 22 may be formed by forming a copper plating film on the resin base 21, and then by patterning the copper plating film. Meanwhile, the inter-layer insulation film 23 may be formed by bonding a resin sheet made of an epoxy resin onto the wiring layer 22 and the resin base 21, and then by thermally curing the resin sheet.

Next, as illustrated in FIG. 3B, through holes 21a having a diameter $r_2$ of about 0.2 mm to 0.3 mm are formed by drilling in the substrate 20.

Thereafter, as illustrated in FIG. 3C, an electro-copper plating film is provided as a first conductor film 25 on an inner surface of each of the through holes 21a and on both the main surfaces 20a, 20b around opening ends of the through hole 21a. The electro-copper plating film is formed with a thickness of about 10 µm to 30 µm by a semi-additive process.

Figure 3D:
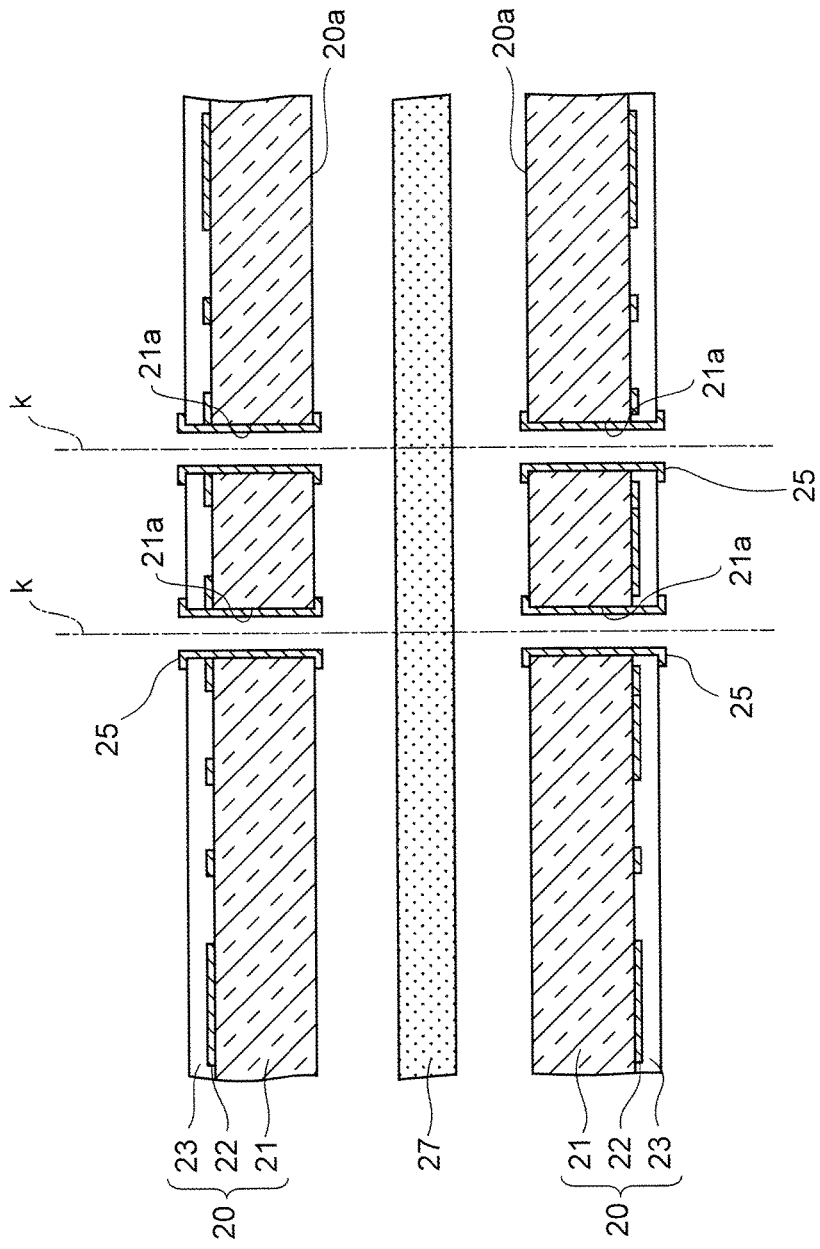

Next, as illustrated in FIG. 3D, two substrates 20 are prepared with the first conductor films 25 formed as described above.

Then, the first main surfaces 20a of the two substrates 20 are opposed to each other with a dielectric 27 sandwiched between the substrates 20.

For the dielectric 27, it is preferable to use a material having a higher dielectric constant than that of the inter-layer insulation film 23, because the dielectric 27 is used to form a capacitor as will be described later. In the first embodiment, a laminate of three PPE adhesive sheets having a thickness of about 50 µm is used as the dielectric 27. As such a PPE adhesive sheet, AD-3396 made by RISHO KOGYO CO., LTD. is available, for example.

This adhesive sheet does not contain a glass cloth. Moreover, in this step, the adhesive sheets are not cured yet and are easily deformed when pressure is applied.

Instead, FR4 having a dielectric constant of 4 may also be used as the material for the dielectric 27.

In addition, in this example, the two substrates 20 are aligned with each other such that the through holes 21a of the upper substrate 20 and the through holes 21a of the lower substrate 20 are positioned on the same axes K, respectively.

Figure 3E:
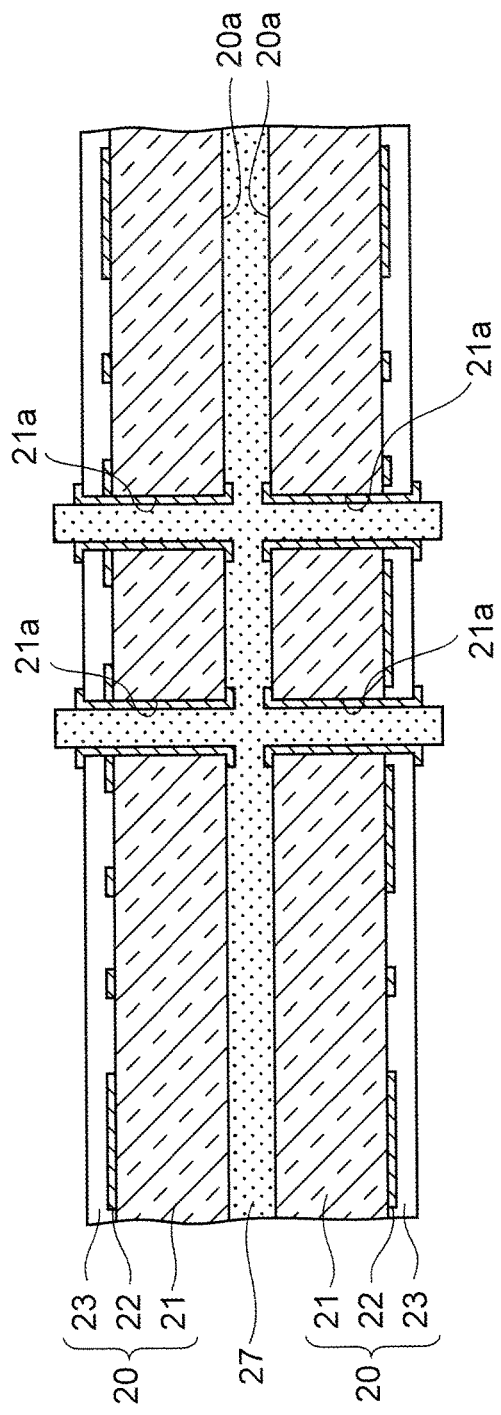

Next, as illustrated in FIG. 3E, the dielectric 27 is pressed from above and below by the two substrates 20, and thereby the dielectric 27 is filled inside the through holes 21a. In this step, the thickness of the dielectric 27 is reduced by an amount of the dielectric 27 filled inside the through holes 21a. The thickness of the dielectric 27 is reduced by about 35% through execution of this step, although the reduction depends on the number and size of the through holes 21a. For this reason, it is preferable to set the thickness of the dielectric 27 in an initial state with this thickness reduction taken into account.

In addition, this way of filling the dielectric 27 inside the through holes 21a makes portions of the dielectric 27 protrude from the through holes 21a.

After that, the dielectric 27 is thermally cured under conditions where the substrate temperature is 170° C. to 180° C. in the atmosphere.

Figure 3F:
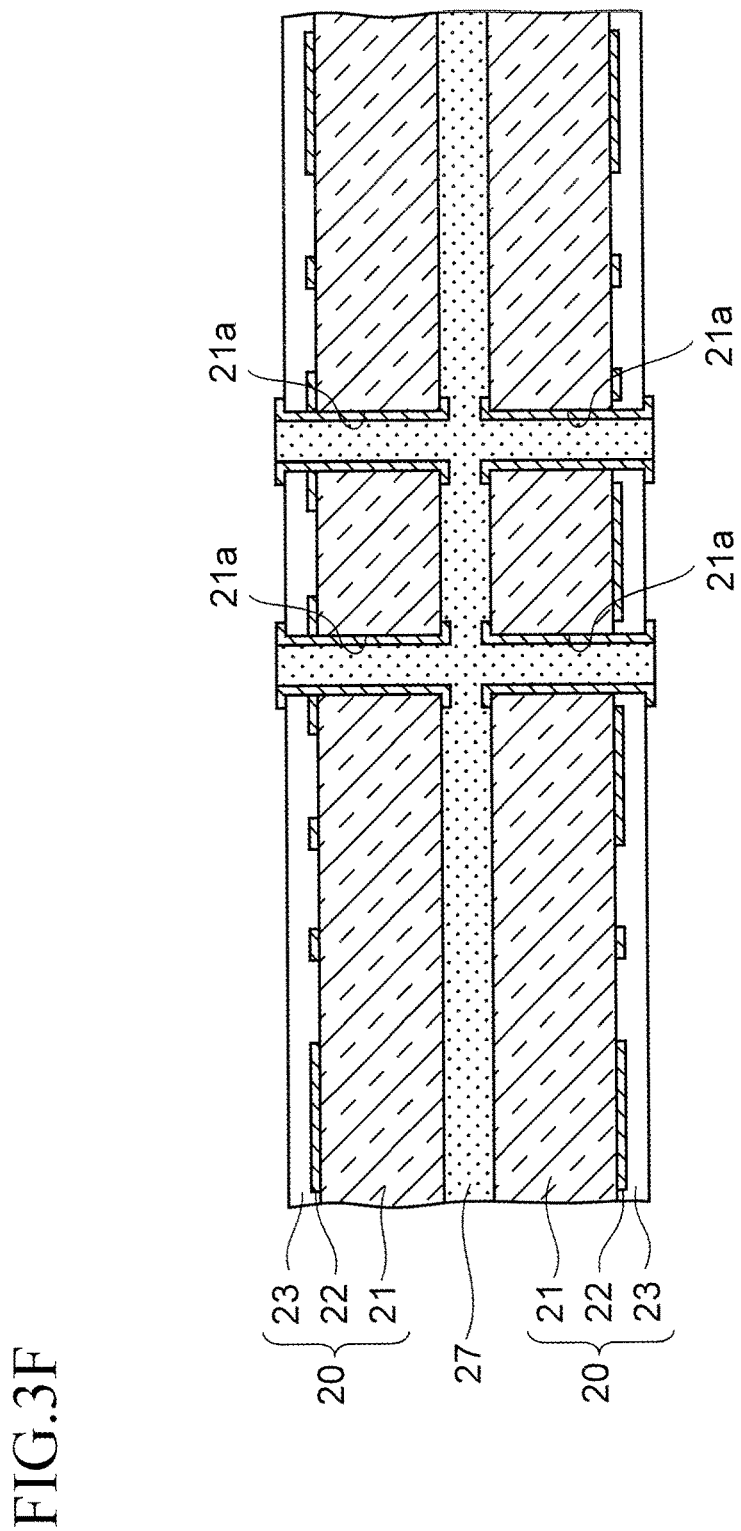

Subsequently, as illustrated in FIG. 3F, the portions of the dielectric 27 protruding from the through holes 21a are removed by grinding.

Figure 3G:
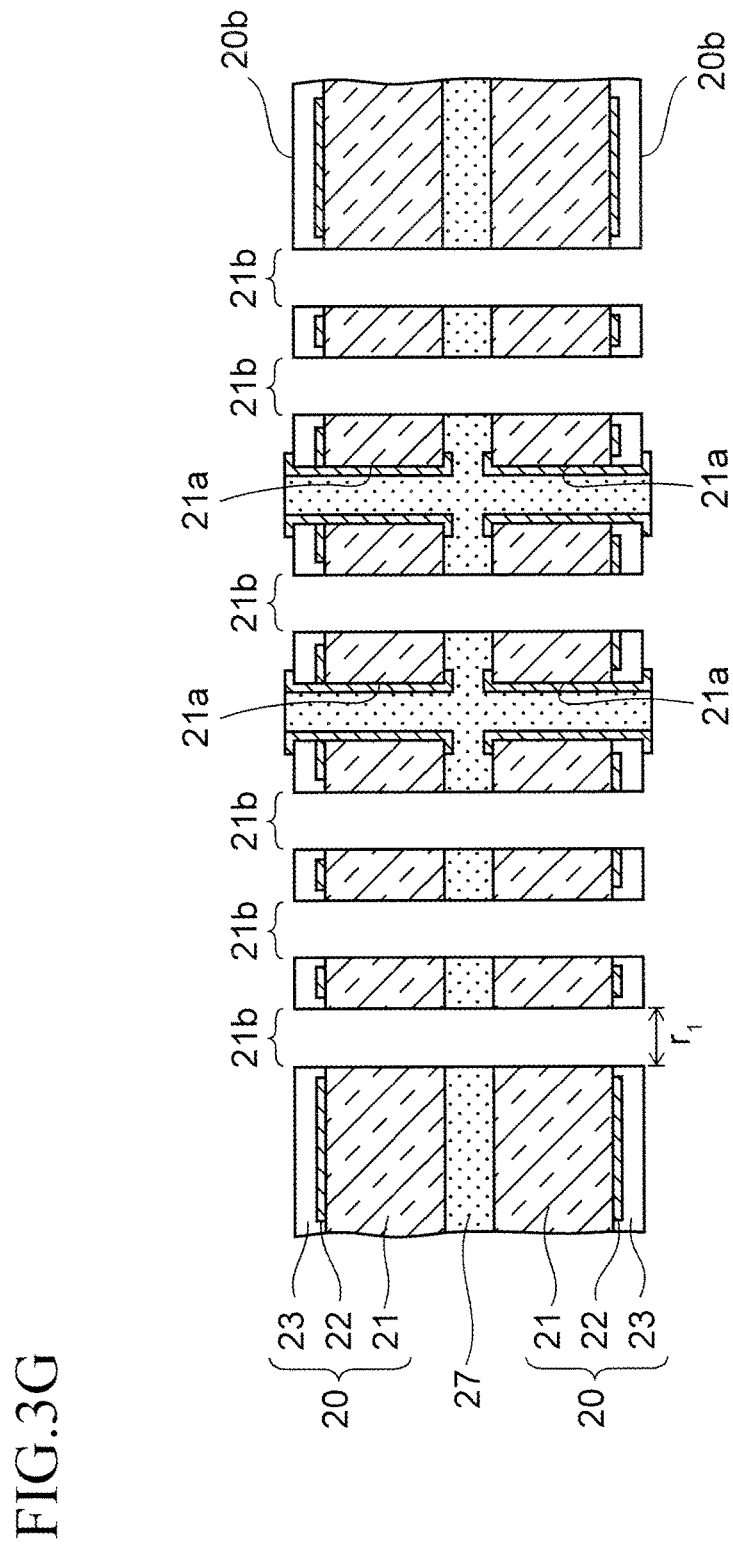

Then, as illustrated in FIG. 3G, multiple holes 21b extending from one main surface 20b to the other main surface 20b are formed by drilling. The holes 21b have a diameter $r_1$ of about 0.2 mm to 0.3 mm as in the through holes 21a.

Figure 3H:
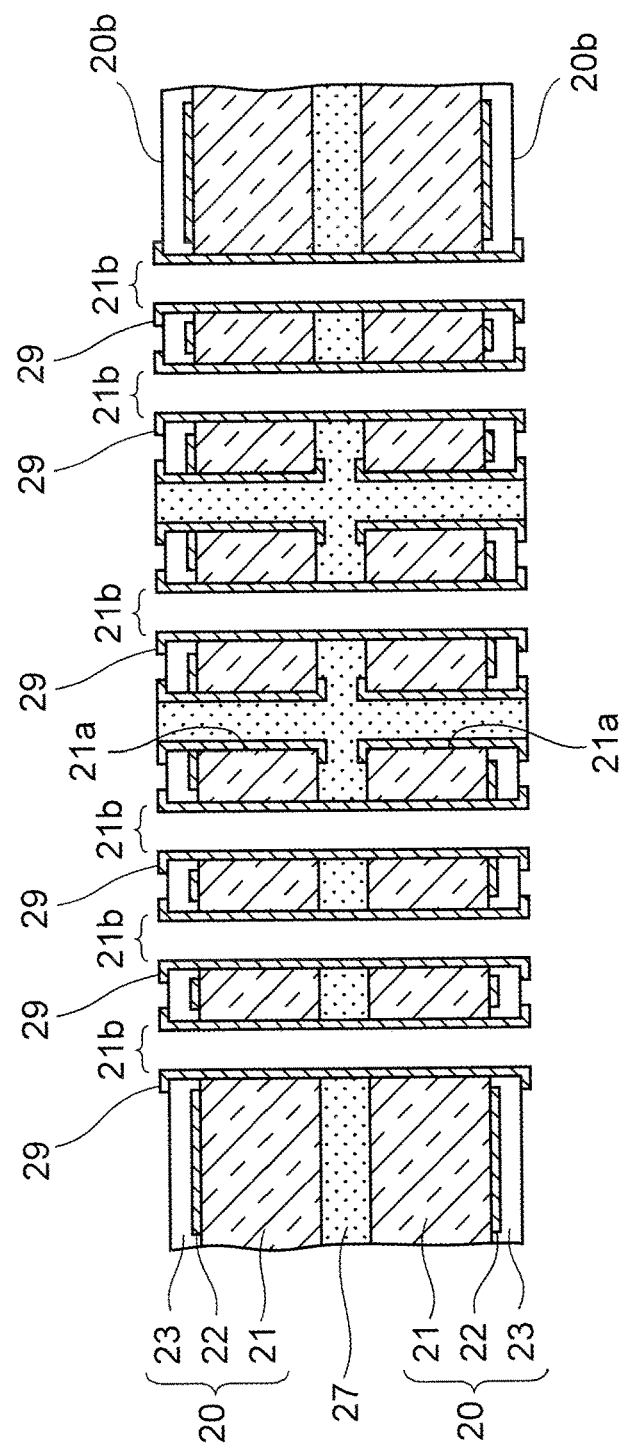

Next, as illustrated in FIG. 3H, an electro-copper plating film 29 is provided on the inner surface of each of the holes 21b and around opening ends of the hole 21b. Here, the electro-copper plating film 29 is formed with a thickness of about 15 µm to 35 µm by a semi-additive process.

Figure 3I:
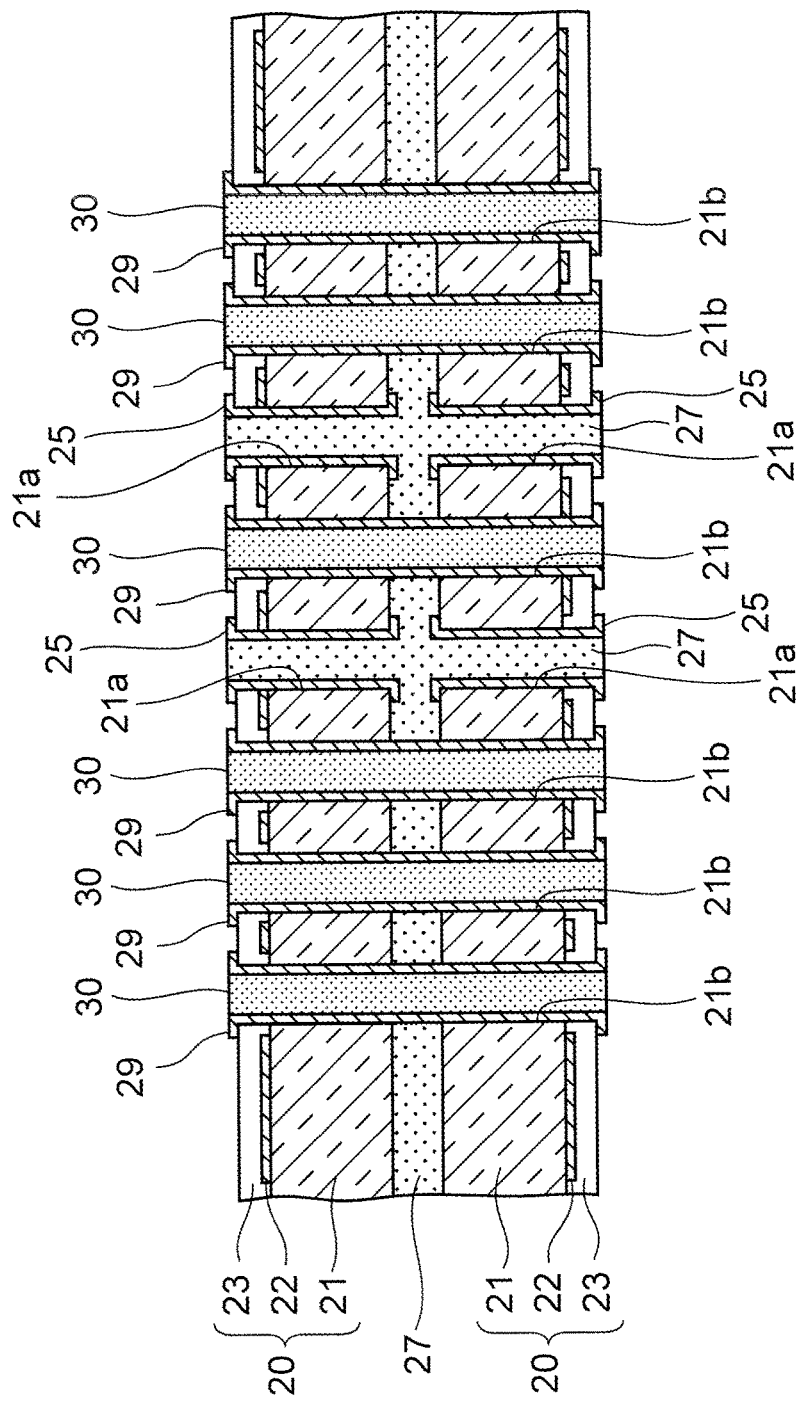

Thereafter, as illustrated in FIG. 3I, a resin 30 such as an epoxy resin is filled inside the holes 21b.

Figure 3J:
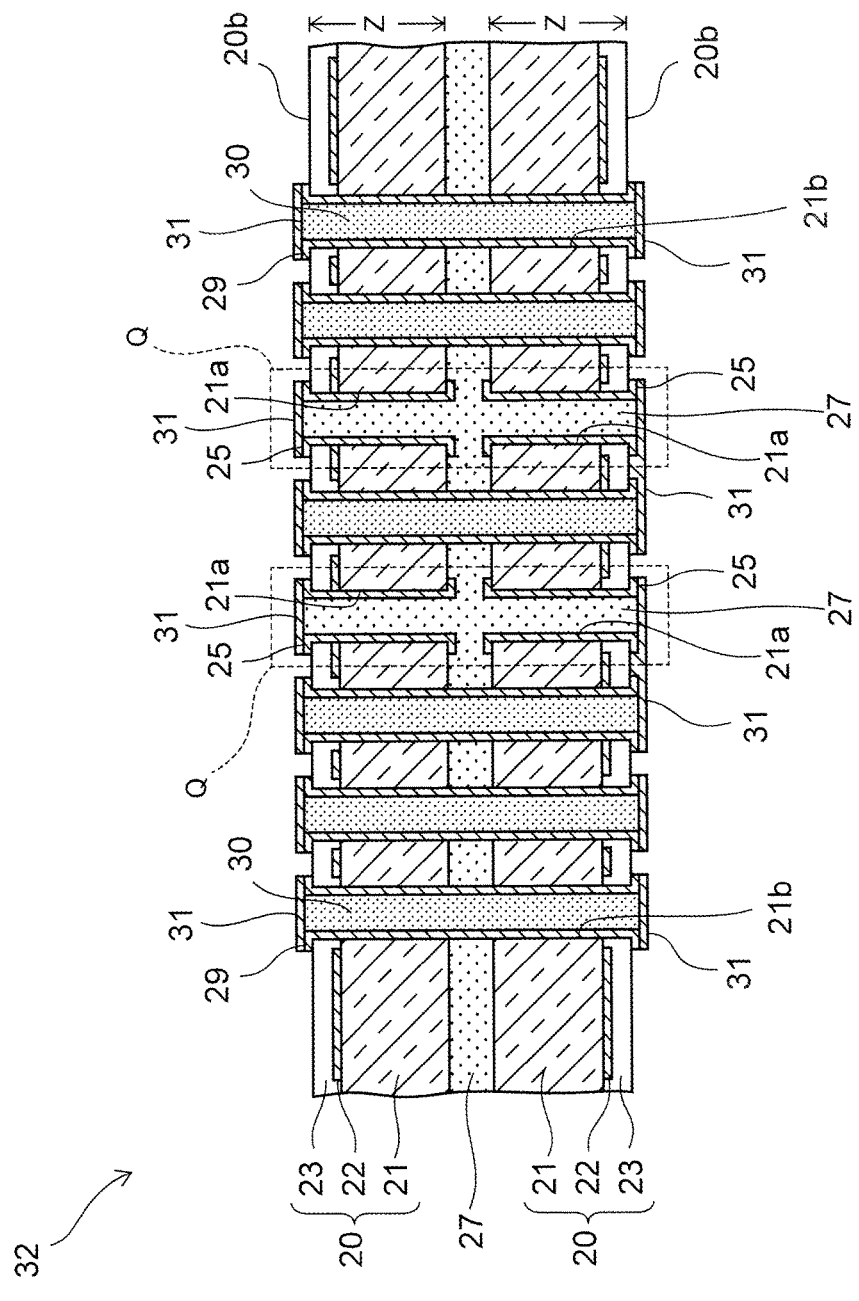

Moreover, as illustrated in FIG. 3J, electro-copper plating films are provided as second conductor films 31 on both the second main surfaces 20b on the front and back sides. The electro-copper plating films 31 are formed with a thickness of about 5 µm to 15 µm by a semi-additive process such that the second conductor films 31 cover the through holes 21a and the holes 21b.

In the foregoing way, a basic structure of a circuit board 32 according to the first embodiment is completed.

In the circuit board 32, the dielectric 27 functions as a dielectric for a capacitor Q, and the first conductor films 25 inside the through holes 21a and the second conductor films 31, which are opposed to each other across the dielectric 27 in the upper-lower direction, function as electrodes for the capacitor Q.

In this method of manufacturing the circuit board 32, the upper and lower substrates 20 are easy to handle because the substrates 20 has a sufficiently large thickness Z of about 0.5 mm to 1 mm. Thus, unlike the case where the sheet-shaped thin capacitor 13 is bonded to the resin base 2 as in the example of FIG. 2, it is easy to sandwich a dielectric 27 between a pair of substrates 20. This reduces a possibility of a defect occurring in the circuit board 32 during manufacturing, and enables easy mass production of the circuit boards 32 in which capacitors Q are incorporated.

Moreover, in a portion of the circuit board 32 provided with no through holes 21a, the dielectric 27 functions as an insulation film which electrically isolates the upper and lower substrates 20 from each other. Thus, the conductor films in the upper and lower substrates 20 may be electrically insulated from each other by the dielectric 27, which secures the sufficient reliability of the circuit board 32.

In addition, the electrostatic capacitance of the capacitor Q may be adjusted by using the depths and diameters of the through holes 21a and the thickness of the first conductor film 25.

Figure 4:
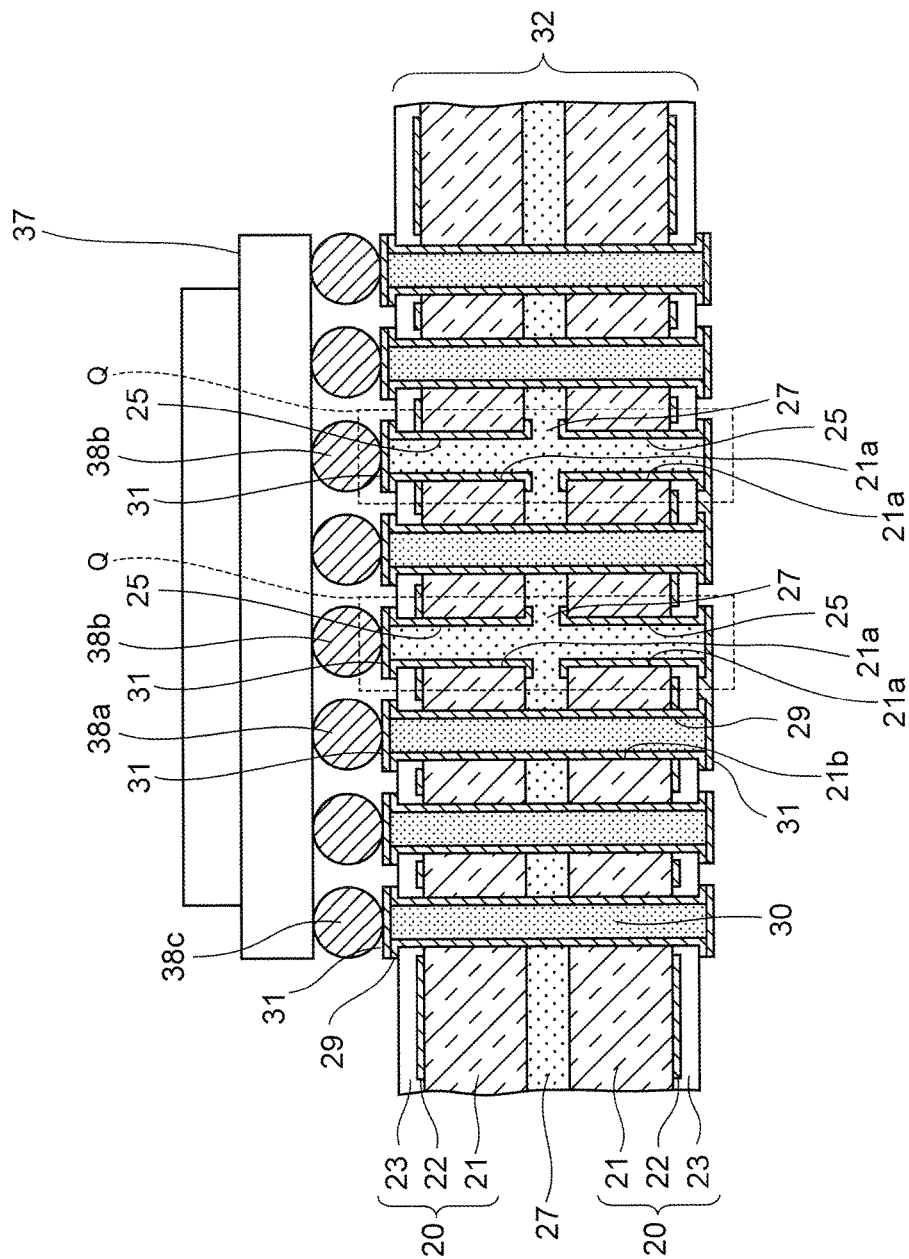
FIG. 4 is a cross sectional view illustrating one example of a semiconductor device including a circuit board according to the first embodiment.

FIG. 4 is a cross sectional view illustrating one example of a semiconductor device including the circuit board 32.

In this semiconductor device, a semiconductor device 37 provided with first to third solder bumps 38a to 38c as external connection terminals is mounted on the circuit board 32.

Then, the through holes 21a and the holes 21b are disposed directly below the solder bumps 38a to 38c. The solder bumps 38a to 38c are connected to the respective second conductor films 31 covering the through holes 21a and the holes 21b, while using the second conductor films 31 as connection pads.

Among these solder bumps, the first solder bump 38a is a bump for power supply, and is connected to the electro-copper plating film 29 inside the corresponding hole 21b. Then, the second solder bump 38b is a bump for ground and is connected to the first conductor film 25 inside the corresponding through hole 21a. Meanwhile, the third solder bump 38c is a bump for signal.

With this structure, a power supply potential and a ground potential are respectively connected to the paired first conductor films 25 forming the capacitor Q, and the capacitor Q functions to reduce the power supply noise.

According to the first embodiment described above, the provision of the through holes 21a above and below the dielectric 27 makes the electrostatic capacitance of the capacitor Q larger than in the case where the through holes 21a are not provided. This advantageous point is explained below.

To begin with, a comparative example is explained.

Figure 5:
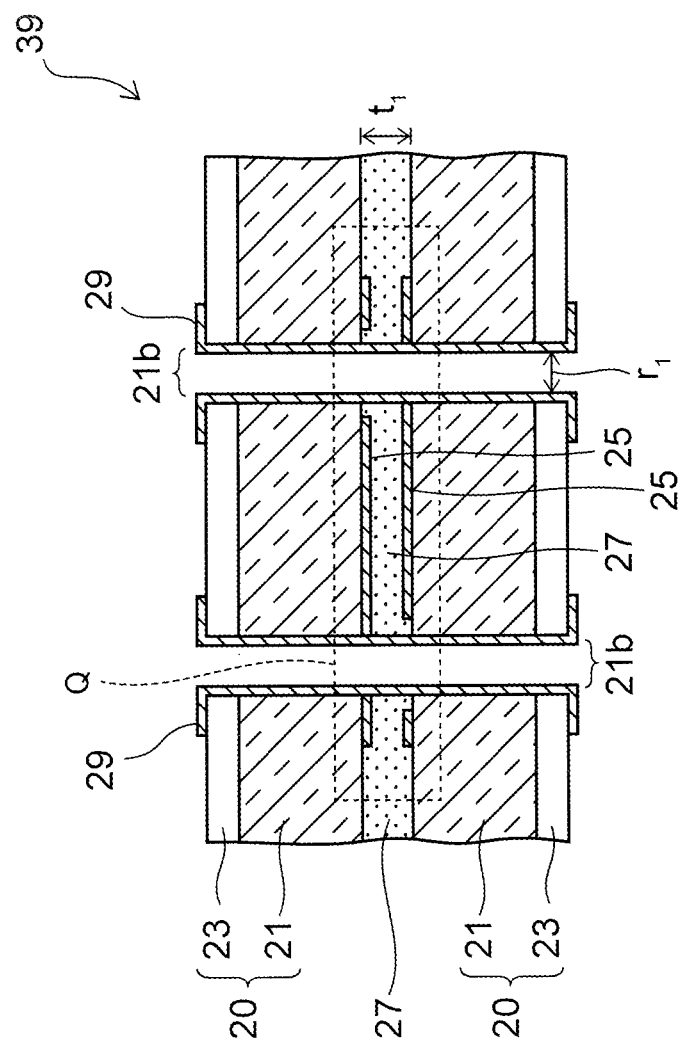
FIG. 5 is a cross sectional view of a circuit board according to a comparative example where no through holes are provided.

FIG. 5 is a cross sectional view of a circuit board 39 according to a comparative example where no through holes 21a are provided.

In FIG. 5, the same elements as those in the first embodiment are indicated by the same reference numerals as those in the first embodiment, and the description thereof is omitted below.

In this comparative example, flat first conductor layers 25 are formed on the upper and lower sides of the dielectric 27 instead of forming the through holes 21a. Thus, the capacitor Q is formed of the conductor layers 25 and the dielectric 27, and the conductor layers 25 are drawn to the front and back sides of the circuit board 39 via the electro-copper plating films 29 inside the holes 21b.

Here, the dielectric 27 has a thickness $t_1$ of 100 µm. This comparative example is prepared in two kinds, one of which uses PPE having a dielectric constant $\mu_1$ of 17.2 as the material for the dielectric 27, and the other of which uses FR4 having a dielectric constant $\mu_1$ of 4 as the material for the dielectric 27.

Table 2 is a table presenting theoretical values obtained by calculating the electrostatic capacitances $C_1$ per unit area of capacitors Q in these comparative examples.

TABLE 2

| Thickness $t_1$ | Dielectric Constant $\mu_1$ | Electrostatic Capacitance $C_1$ (pF/cm$^2$) |
|---|---|---|
| 100 µm | 4 | 0.0035 |
| 100 µm | 17.2 | 0.0150 |

Meanwhile, Table 3 is a table obtained by actually measuring the electrostatic capacitances $C_1$ per unit area of capacitors Q in these comparative examples.

TABLE 3

| Thickness $t_1$ | Diameter $r_1$ (mm) | Electrostatic Capacitance $C_1$ (pF/cm$^2$) |
|---|---|---|
| 50 µm | 0.20 | 0.717 |
| 50 µm | 0.25 | 0.616 |
| 50 µm | 0.30 | 0.698 |
| 100 µm | 0.20 | 0.560 |
| 100 µm | 0.25 | 0.629 |
| 100 µm | 0.30 | 0.654 |

In Table 3, the electrostatic capacitance $C_1$ is measured in each combination of the conditions where the thickness $t_1$ of the dielectric 27 is 50 µm and 100 µm, and where the diameter $r_1$ of the hole 21b is 0.2 mm, 0.25 mm, and 0.3 mm. In addition, PPE having a dielectric constant of 17.2 is used as the material for the dielectric 27.

As is clear from a comparison between Table 2 and Table 3, the actually measured values (Table 3) are larger than the theoretical values (Table 2). Even in the case of the actually measured values in Table 3, however, the electrostatic capacitance $C_1$ per unit area is still at most about 0.717 pF/cm$^2$.

On the other hand, Table 4 is a table obtained by measuring the electrostatic capacitances $C_2$ per unit area of the capacitors Q in the circuit boards 32 (see FIG. 3J) according to the first embodiment.

TABLE 4

| Thickness $t_1$ | Diameter $r_2$ (mm) | Electrostatic Capacitance $C_2$ (pF/cm$^2$) |
|---|---|---|
| 50 µm | 0.20 | 57.46 |
| 50 µm | 0.25 | 57.03 |
| 50 µm | 0.30 | 56.09 |
| 100 µm | 0.20 | 30.37 |
| 100 µm | 0.25 | 28.72 |
| 100 µm | 0.30 | 30.86 |

In the examination of Table 4, the electrostatic capacitance $C_2$ is measured in each combination of the conditions where the thickness $t_1$ of the dielectric 27 is 50 µm and 100 µm, and where the diameter $r_2$ of the through hole 21a is 0.2 mm, 0.25 mm, and 0.3 mm. In addition, FR4 having a dielectric constant of 4 is used as the material for the dielectric 27. Moreover, as illustrated in FIG. 3D, the through holes 21a of the upper substrate 20 and the through holes 21a of the lower substrate 20 are aligned on the same axes K, respectively.

Further, the number of through holes 21a per unit area (1 cm$^2$) is set to 5. This setting also applies to examinations in Tables 5 to 7 which will be presented below.

As presented in Table 4, even though the dielectric 27 in this example has a dielectric constant of 4 which is lower than the dielectric constant (17.2) in Table 3, a comparison between Tables 4 and 3 in the same row makes it apparent that the electrostatic capacitance $C_2$ in this example is 46 to 92 times larger than that in the comparative example in Table 3. This is a new finding unexplainable just because the through holes 21a enlarge the area where the electrodes of the capacitor are opposed to each other.

In addition, Table 5 is a table obtained by conducting the same examination as in Table 4 while using PPE having a dielectric constant of 17.2 as the material for the dielectric 27.

TABLE 5

| Thickness $t_1$ | Diameter $r_2$ (mm) | Electrostatic Capacitance $C_2$ (pF/cm$^2$) |
|---|---|---|
| 50 µm | 0.20 | 153.4 |
| 50 µm | 0.25 | 153.8 |
| 50 µm | 0.30 | 152.1 |
| 100 µm | 0.20 | 101.7 |
| 100 µm | 0.25 | 102.2 |
| 100 µm | 0.30 | 100.7 |

As presented in Table 5, the electrostatic capacitance $C_2$ in this example is larger, more specifically, 153 to 249 times larger than that in the comparative example in Table 3, as compared in the same row.

In the first embodiment, since the capacitors Q having such a large electrostatic capacitance $C_2$ may be incorporated inside the circuit board 32, the number of capacitor components to be mounted on the surface of the circuit board 32 may be largely reduced.

For instance, a circuit board for use in a server with a transmission frequency of 3.2 GHz uses about 250 low-capacity capacitor components with an electrostatic capacitance of about 10 pF, and the total sum of the electrostatic capacitance in a single circuit board is about 2500 pF, as described above. According to Table 5, in the first embodiment, the circuit board 32 formed in a rectangular shape of several centimeters square may have an electrostatic capacitance approximately equal to the aforementioned 2500 pF. Thus, there is no need to mount as many as 250 capacitor components on the surface of the circuit board 32.

As a result, electronic components other than the capacitor components may be mounted on the surface of the circuit board 32, and thus the circuit board 32 may achieve a higher density and higher functionality.

In addition, since the high-capacity capacitors Q can be incorporated inside the circuit board 32 as mentioned above, the circuit board 32 is also usable as a board for high speed transmission with a transmission frequency of 5.0 GHz and a transmission rate of 10 Gbps.

Moreover, a capacitor Q may be formed in any portion of the circuit board 32 as long as the portion is located at a place where the through hole 21a may be arranged. Thus, there is no great harm in designing the circuit board 32.

Further, since the upper through holes 21a and the lower through holes 21a are aligned on the same axes K as in FIG. 3D, the through holes 21a are located in the same positions in the upper and lower substrates 20. This allows the same design of the through holes 21a to be applied to both the substrates 20, and reduces a burden in designing each of the substrates 20.

Furthermore, since there is no need to mount capacitor components as mentioned above, it is possible to eliminate the inductance and resistance of a conductor pattern connecting the capacitor components and a semiconductor device.

The inventor of the present application makes a trial calculation of how much the inductance and the resistance may be reduced.

Figure 6:
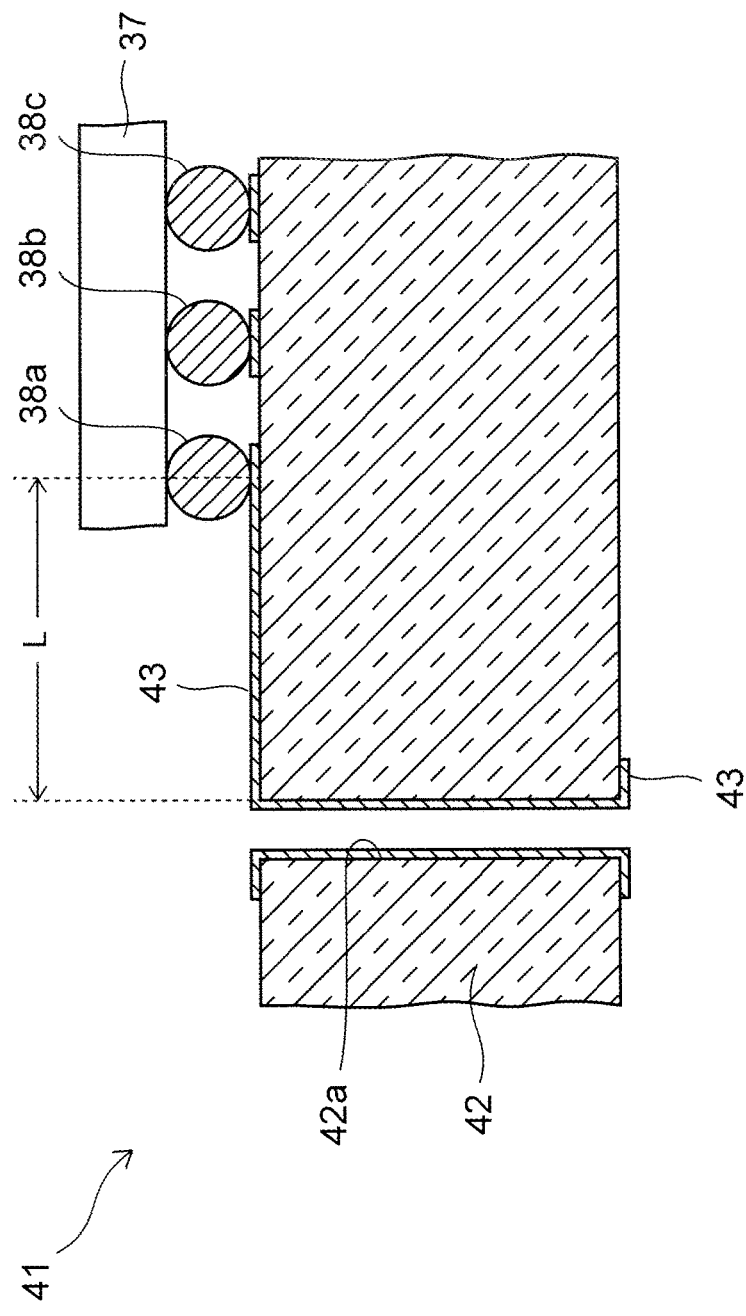
FIG. 6 is a schematic cross sectional view of a model used to make a trial calculation of how much inductance and resistance may be reduced in the first embodiment.

FIG. 6 is a schematic cross sectional view of a model used to make the trial calculation.

In FIG. 6, the same elements as those in the first embodiment are indicated by the same reference numerals as those in the first embodiment, and the description thereof is omitted below.

As illustrated in FIG. 6, a circuit board 41 in this model includes an insulative base 42 in which a through hole 42a is formed. Then, a conductor pattern 43 made of copper is formed on an inner surface of the through hole 42a and on the main surfaces of the insulative base 42 around the through hole 42a. A semiconductor device 37 is connected to the conductor pattern 43 via a first solder bump 38a.

The trial calculation is made under the following conditions: a pitch of the solder bumps 38a to 38c is 1 mm; a line width of the conductor pattern 43 on the main surface of the insulative base 42 is 0.5 mm; and the thickness of the conductor pattern 43 is 50 μm. In addition, the distance L from the through hole 42a to the solder bump 38a is 0.7 mm, the thickness of the insulative base 42 is 1 mm, and the diameter of the through hole 42a is 0.25 mm.

As a result of calculation under the above conditions, the inductance and the resistance of the conductor pattern 43 on the main surface of the insulative base 42 are 0.23 nH and 481.6 μΩ, respectively. Then, the inductance and the resistance of the conductor pattern 43 inside the through hole 42a are 0.63 nH and 701.1 μΩ, respectively.

In contrast to this, in the first embodiment, the second solder bump 38b is connected to the second conductor film 31 directly above the through hole 21a as illustrated in FIG. 4. Thus, the inductance and the resistance of the second conductor film 31 on the main surface of the circuit board 32 may be ignored.

Moreover, the first conductor films 25 inside the through holes 21a are not for forming a wiring, but are for forming the capacitor Q. Thus, the inductance and the resistance of the first conductor films 25 may be ignored, too.

As mentioned above, since the inductance and the resistance, which occur in the model of FIG. 6, may be ignored, the first embodiment enables an increase in the transmission rate of the circuit board 32 and makes it unnecessary to forcibly increase the capacitance of the capacitor Q with the inductance and the resistance taken into account.

Incidentally, in the foregoing first embodiment, the through holes 21a of the upper substrate 20 and the through holes 21a of the lower substrate 20 are aligned on the same axes K, respectively, as illustrated in FIG. 3D. However, the first embodiment is not limited to this.

Hereinafter, various modifications of the first embodiment are described.

Figure 7:
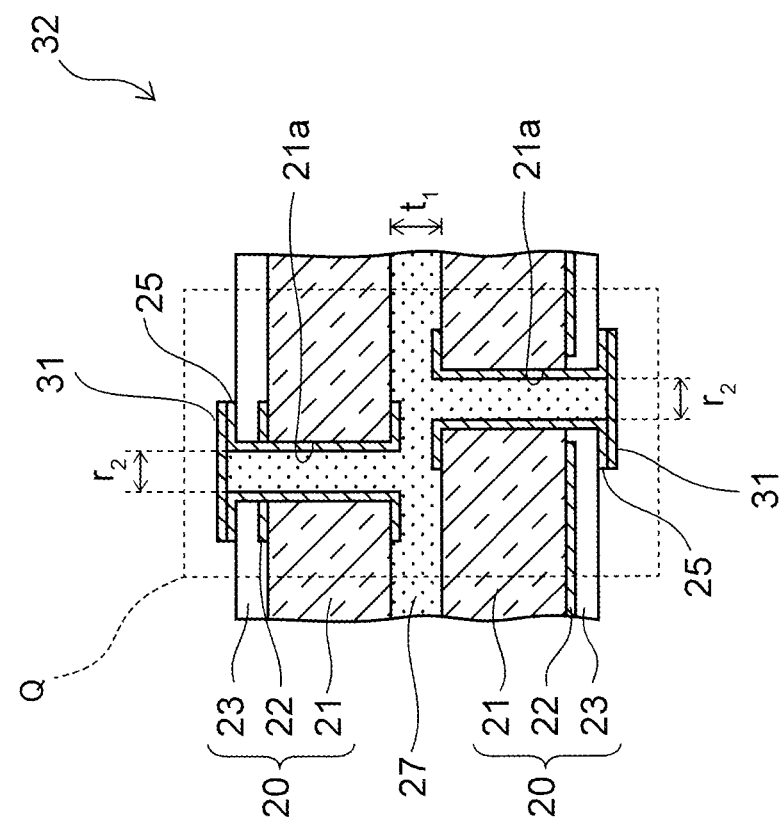
FIG. 7 is an enlarged cross sectional view of a circuit board according to a first modification of the first embodiment.

(First Modification) FIG. 7 is an enlarged cross sectional view of a circuit board 32 according to a first modification.

In FIG. 7, the same elements as those in FIG. 3J are indicated by the same reference numerals as those in FIG. 3J, and the description thereof is omitted below. This also applies to FIGS. 8 to 10 which will be described later.

In the example of FIG. 7, the positions of through holes 21a of two substrates 20 are offset from each other in a lateral direction of the substrates 20.

Table 6 is a table obtained by measuring the electrostatic capacitances $C_2$ of capacitors Q in the first modification.

TABLE 6

| Thickness $t_1$ | Diameter $r_2$ (mm) | Electrostatic Capacitance $C_2$ (pF/cm$^2$) |
|---|---|---|
| 50 μm | 0.20 | 152.5 |
| 50 μm | 0.25 | 151.4 |
| 50 μm | 0.30 | 151.2 |
| 100 μm | 0.20 | 101.8 |
| 100 μm | 0.25 | 101.5 |
| 100 μm | 0.30 | 101.5 |

Note that the first modification uses PPE having a dielectric constant of 17.2 as the material for the dielectric 27.

As presented in Table 6, the electrostatic capacitances $C_2$ in the first modification are also increased from those in the comparative examples in Table 3.

Moreover, an increase in the electrostatic capacitance may be expected even through the upper and lower through holes 21a are offset from each other in the lateral direction of the substrates 20. This increases design flexibility of the positions of the through holes 21a in the circuit board 32.

Figure 8:
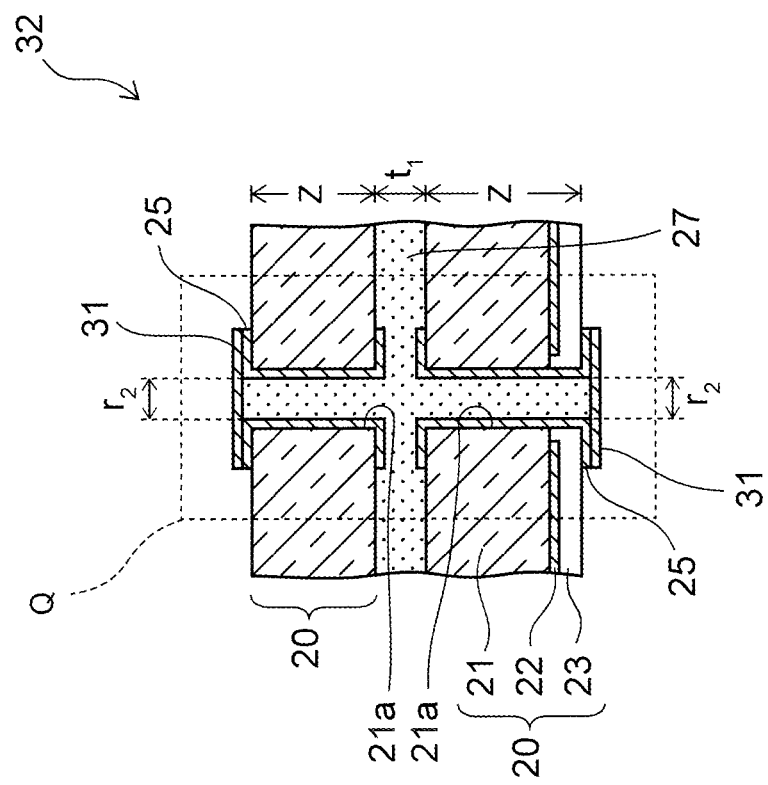
FIG. 8 is an enlarged cross sectional view of a circuit board according to a second modification of the first embodiment.

(Second Modification) FIG. 8 is an enlarged cross sectional view of a circuit board 32 according to a second modification.

In the second modification, the wiring layer 22 and the inter-layer insulation film 23 are not provided to one of two substrates 20. Thereby, the two substrates 20 are made different from each other in thickness Z, so that the upper and lower through holes 21a have different depths.

Instead, the upper and lower through holes 21a may be formed with different depths in such a way that the resin bases 21 of the upper and lower substrates 20 are formed with different thicknesses. In addition, the upper and lower through holes 21a are aligned on the same axis as in the example of FIG. 3D.

Table 7 is a table obtained by measuring the electrostatic capacitances $C_2$ of capacitors Q in the second modification.

TABLE 7

| Thickness $t_1$ | Diameter $r_2$ (mm) | Electrostatic Capacitance $C_2$ (pF/cm$^2$) |
|---|---|---|
| 50 μm | 0.20 | 167.7 |
| 50 μm | 0.25 | 166.7 |
| 50 μm | 0.30 | 168.6 |
| 100 μm | 0.20 | 107.2 |
| 100 μm | 0.25 | 105.3 |
| 100 μm | 0.30 | 104.6 |

Note that the second modification uses PPE having a dielectric constant of 17.2 as the material for the dielectric 27.

In addition, the thickness Z of the upper substrate 20 is 0.5 mm and the thickness Z of the lower substrate 20 is 1.0 mm.

As presented in Table 7, the electrostatic capacitances $C_2$ in the second modification are also increased from those in the comparative examples in Table 3.

Moreover, since the sufficient electrostatic capacitance may be obtained even through the upper and lower through holes 21a are different in depth, design flexibility of the thickness of each substrate 20 increases.

Figure 9:
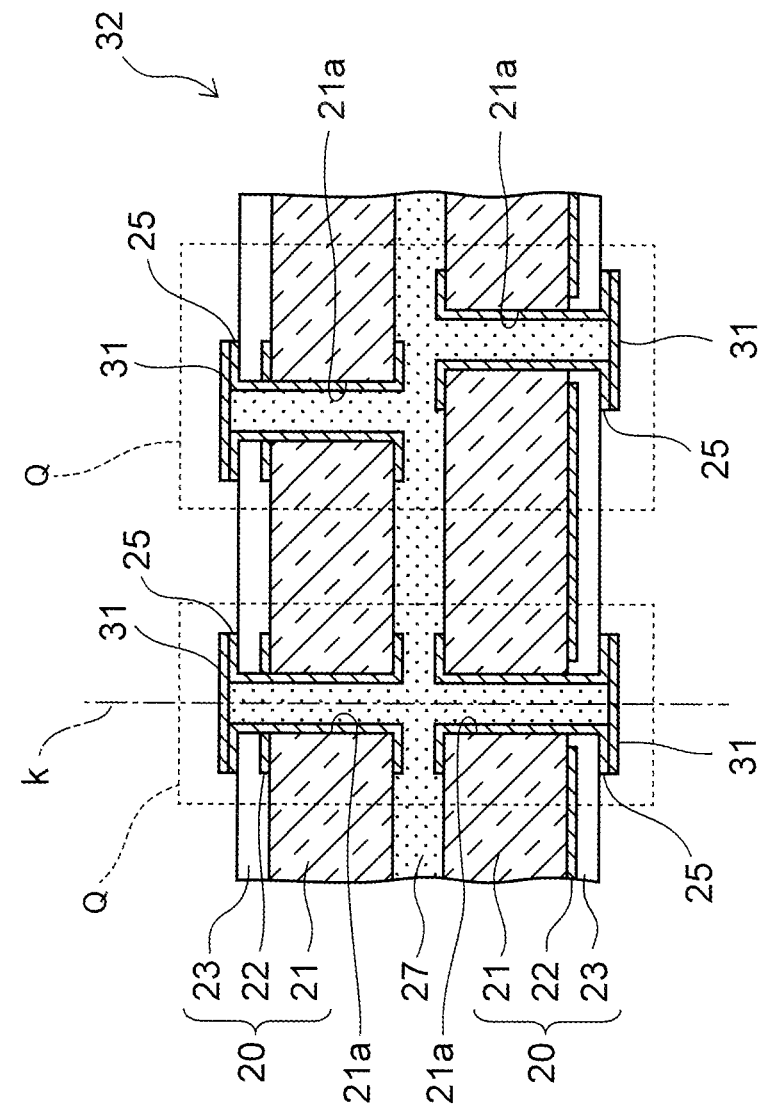
FIG. 9 is an enlarged cross sectional view of a circuit board according to a third modification of the first embodiment.

(Third Modification) FIG. 9 is an enlarged cross sectional view of a circuit board 32 according to a third modification.

In the third modification, more than one through hole 21a is provided to each of two substrates 20, and at least one pair of these upper and lower through holes 21a are aligned on the same axis K, while the rest of the upper and lower through holes 21a are offset from each other in position.

With this structure, variations of the through holes 21a in the circuit board 32 increase, and thus the design flexibility of the circuit board 32 increases.

Figure 10:
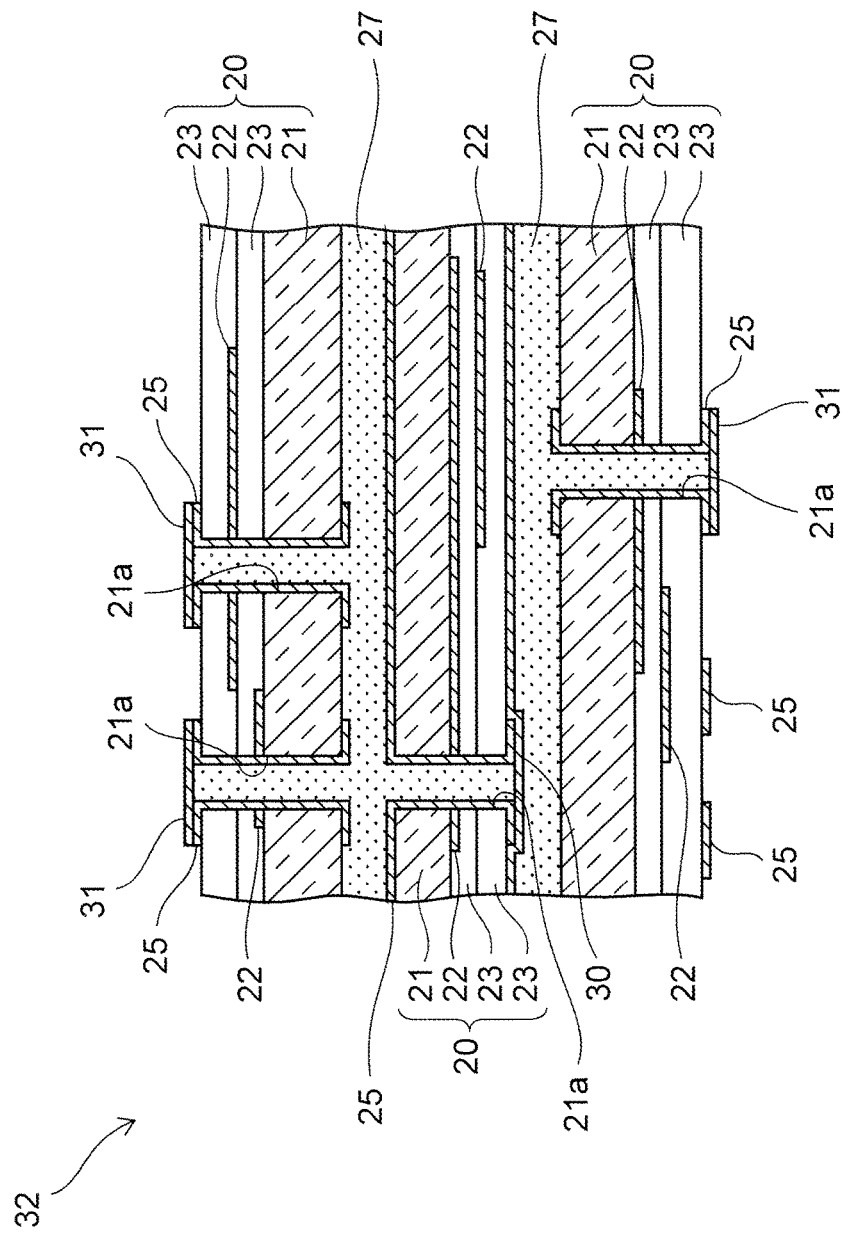
FIG. 10 is an enlarged cross sectional view of a circuit board according to a fourth modification of the first embodiment.

(Fourth Modification) FIG. 10 is an enlarged cross sectional view of a circuit board 32 according to a fourth modification.

In the fourth modification, three substrates 20 are stacked. In this structure, an increase in the electrostatic capacitance of capacitors incorporated in the circuit board 32 may also be expected for the same reasons as those in the first to third modifications. Here, the number of stacked substrates 20 is not limited to three, but four or more substrates 20 may be stacked.

Second Embodiment

In the first embodiment, the through holes 21a are formed in both the upper and lower substrates 20 as illustrated in FIG. 3J and others. In contrast to this, in the second embodiment, through holes 21a are formed in one of upper and lower substrates 20.

Figure 11A:
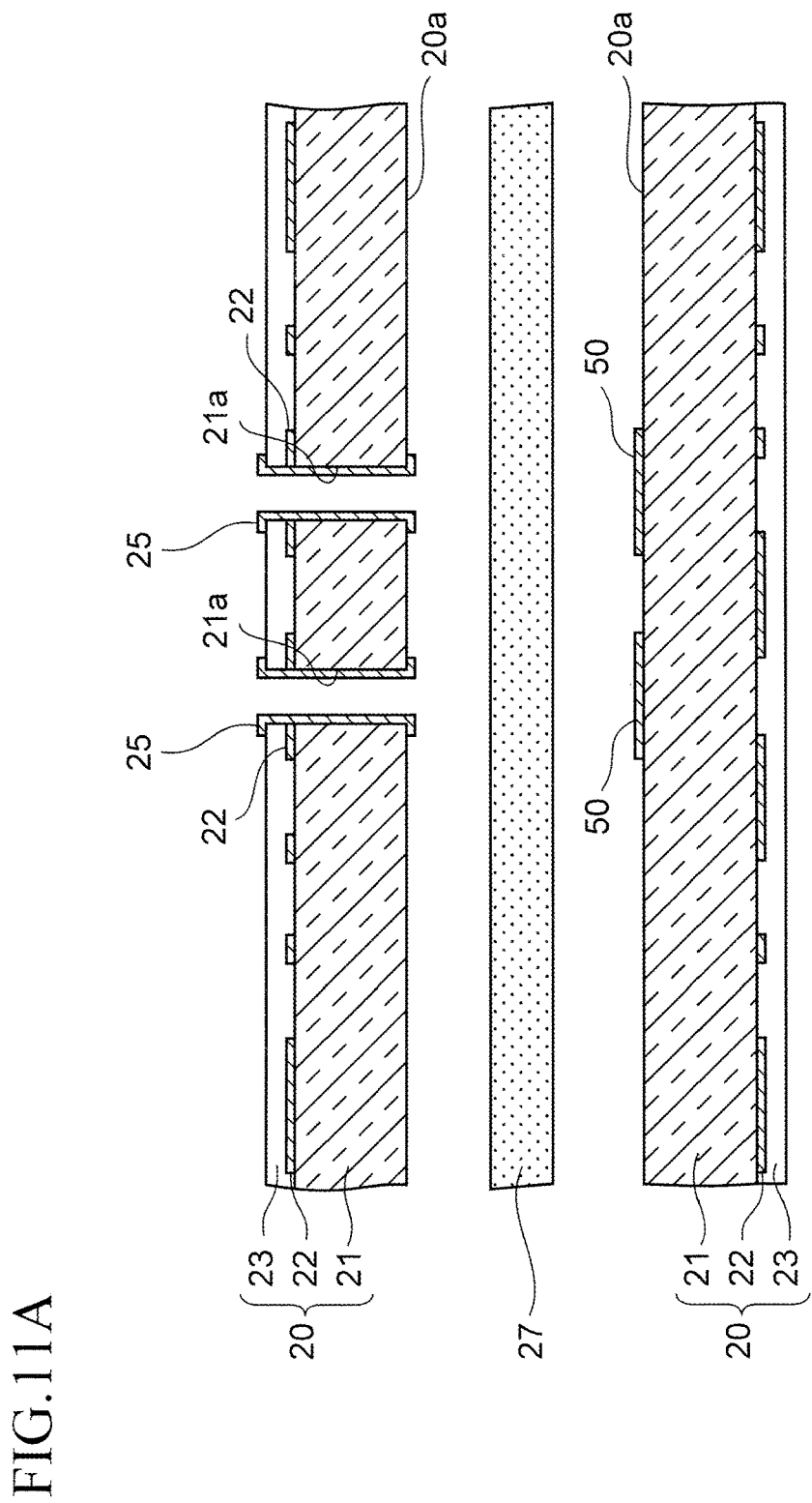
FIGS. 11A to 11c are cross sectional views of a circuit board in the process of manufacturing according to a second embodiment.
Figure 11B:
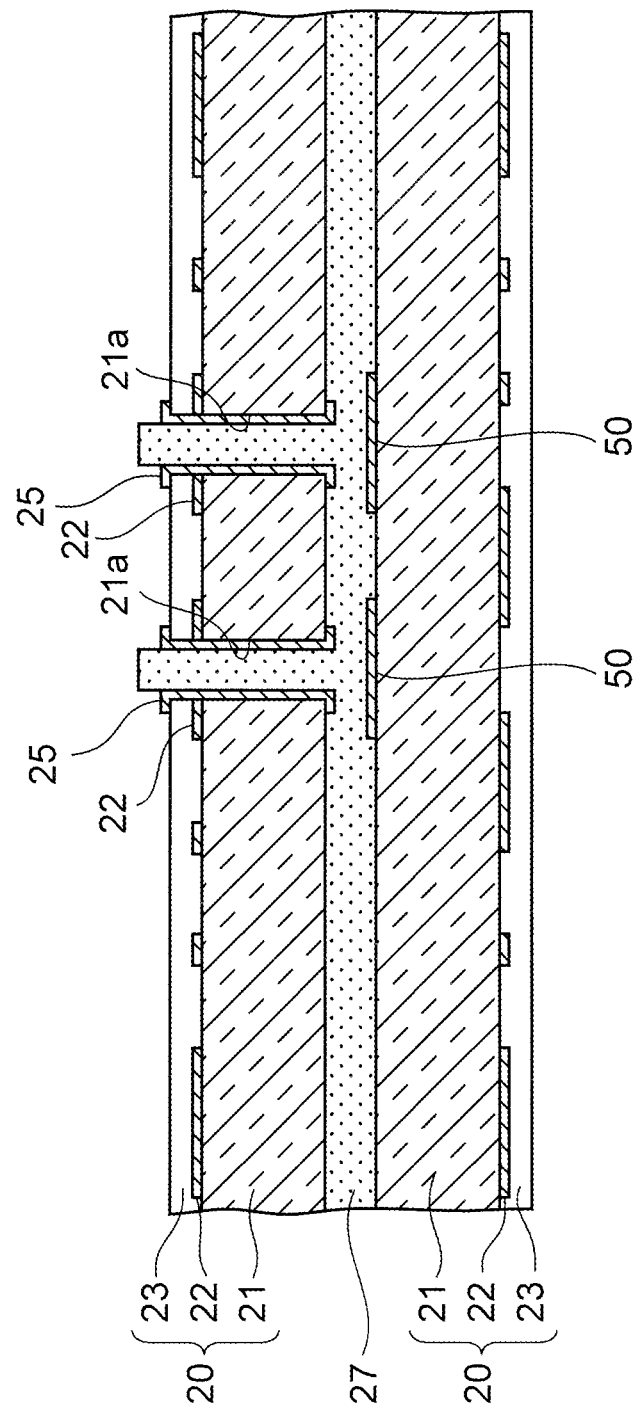
Figure 11C:
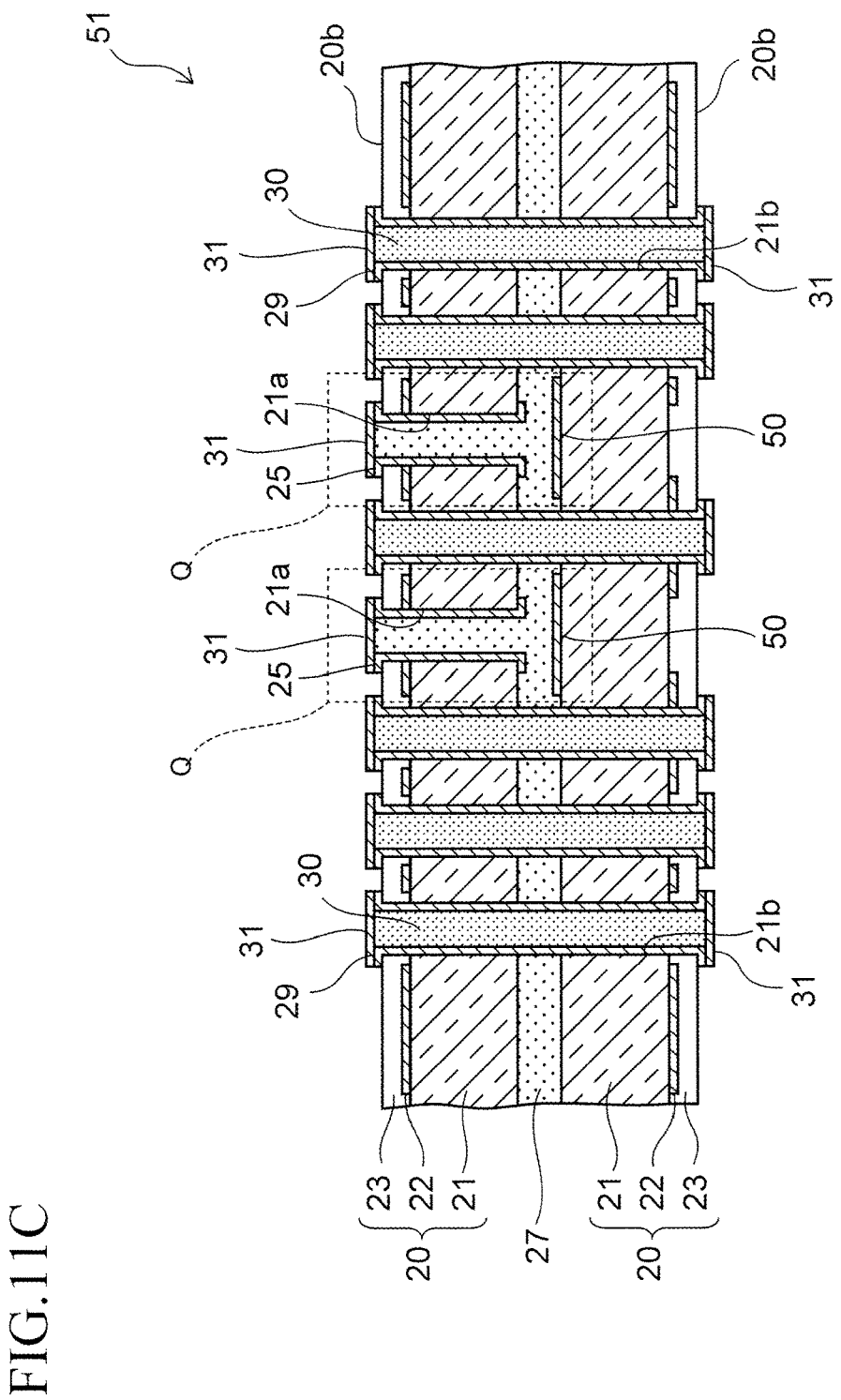

FIGS. 11A to 11C are cross sectional views of a circuit board in the process of manufacturing according to the second embodiment. In FIGS. 11A to 11C, the same elements as those in the first embodiment are indicated by the same reference numerals as those in the first embodiment, and the description thereof is omitted below.

First, as illustrated in FIG. 11A, the main surfaces 20a of upper and lower substrates 20 are opposed to each other with a dielectric 27 interposed between the two substrates 20.

Of the two substrates 20, the upper substrate 20 is formed by performing the steps in FIGS. 3A to 3C in the first embodiment, and includes through holes 21a on each of which a first conductive layer 25 is formed.

On the other hand, the lower substrate 20 is not provided with any through hole 21a, but includes third conductor films 50 on the main surface 20a opposed to the through holes 21a in the upper substrate 20.

The method of forming third conductor films 50 is not particularly limited. In this example, electro-copper plating films with a thickness of about 10 μm to 30 μm are formed as the third conductor films 50 by a semi-additive process.

In addition, a laminate of three PPE adhesive sheets having a thickness of about 50 μm is used as the dielectric 27, as in the first embodiment. As such a PPE adhesive sheet, AD-3396 made by RISHO KOGYO CO., LTD. is available, for example.

Thereafter, as illustrated in FIG. 11B, the dielectric 27 is pressed from above and below by the two substrates 20, and thereby the dielectric 27 is filled inside the through holes 21a. Subsequently, the dielectric 27 is thermally cured under conditions where the substrate temperature is 170° C. to 180° C. in the atmosphere.

After that, the steps in FIGS. 3E to 3J in the first embodiment are performed to obtain a basic structure of a circuit board 51 according to the second embodiment illustrated in FIG. 11C.

In this circuit board 51, the dielectric 27 also functions as a dielectric for a capacitor Q as in the first embodiment. One of electrodes of the capacitor Q is the third conductor film 50 formed on the lower substrate 20. The other electrode of the capacitor Q is the first conductor film 25 inside the through hole 21a in the upper substrate 20 and the second conductor film 31 over the through hole 21a.

On the analogy of the first embodiment, an increase in the electrostatic capacitance of the capacitors Q may also be expected in the second embodiment.

In addition, since no through holes 21a are formed in the lower substrate 20, second conductor films 31 for covering the through holes 21a do not have to be formed on the second main surface 20b of the lower substrate 20. Thus, the second main surface 20b has more room to route wirings.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A circuit board comprising:
    two substrates having front surfaces and back surfaces, respectively, the back surfaces opposed to each other;
    inter-layer insulating films on the front surfaces of the two substrates, respectively;
    a dielectric, a first part of which is interposed between the back surfaces;
    a first through hole extending through each of the two substrates from each of the inter-layer insulating films to each of the back surfaces, filled with a second part of the dielectric and facing the first part of the dielectric;
    a second through hole extending through the two substrates from one of the inter-layer insulating films to the other one of the inter-layer insulating films;
    a first conductor film extending on an inner surface of the first through hole;
    a second conductor film covering over the first through hole on each of the front surfaces, the second conductor film connected to the first conductor film on the each of the front surfaces; and
    an electro-copper plating film extending on an inner surface of the second through hole, wherein
    the dielectric has a higher dielectric constant than that of the inter-layer insulating films,
    the first conductor film and the second conductor film of each one of the two substrates are each one of a pair of electrodes for a capacitor, and
    the first conductor film has a part exposed to the first part of the dielectric, and the part of the first conductor film is not in connection with any other conductors including the electro-copper plating film.

2. The circuit board according to claim 1, wherein the first through hole of the one of the two substrates and the first through hole of the other one of the two substrates are aligned on a same axis.

3. The circuit board according to claim 1, wherein the through holes of the two substrates are offset from each other in a lateral direction of the substrates.

4. The circuit board according to claim 1, wherein
a plurality of the through holes are formed in each of the two substrates,
at least one pair of the plurality of through holes in the two substrates are aligned on a same axis, and
the rest of the plurality of through holes in the two substrates are offset from each other in a lateral direction of the substrates.

5. The circuit board according to claim 1, wherein the through holes of the two substrates have different depths.

6. The circuit board according to claim 1, wherein
three or more of the substrates are provided, and
the three or more of substrates are stacked on one another.

7. The circuit board according to claim 1, wherein the second conductor film is a connection pad to be connected to an external connection terminal of a semiconductor device to be mounted on the substrate.

8. The circuit board according to claim 7, wherein the first through hole is positioned directly below the external connection terminal.

9. A circuit board comprising:
two substrates one of which has a first front surface and a first back surface and the other one of which has a second front surface and a second back surface, the first back surface and second back surface opposed to each other;
inter-layer insulating films on the first front surface and the second front surface, respectively;
a dielectric, a first part of which is interposed between the first back surface and the second back surface;
a first through hole extending through the one of the two substrates from one of the inter-layer insulating films on the first front surface to the first back surface and filled with a second part of the dielectric;
a second through hole extending through the two substrates from one of the inter-layer insulating films on the first front surface to the other one of the inter-layer insulating films on the second front surface;
a first conductor film extending on an inner surface of the first through hole;
a second conductor film covering over the first through hole on the first front surface, the second conductor film connected to the first conductor film on the first front surface;
a third conductor film formed on the second back surface, and opposed to the first through hole, where the first part of the dielectric is interposed between the third conductor film and the first through hole; and
an electro-copper plating film extending on an inner surface of the second through hole, wherein
the dielectric has a higher dielectric constant than that of the inter-layer insulating films,
the first conductor film and the second conductor film are one of a pair of electrodes for a capacitor while the third conductor film is the other one of the pair of the electrodes, and
the first conductor film has a part exposed to the first part of the dielectric, and the part of the first conductor film and the third conductor film are not in connection with any other conductors including the electro-copper plating film.

* * * * *